US007006024B2

(12) United States Patent
Keaveney et al.

(10) Patent No.: US 7,006,024 B2
(45) Date of Patent: Feb. 28, 2006

(54) VARIABLE MODULUS INTERPOLATOR, AND A VARIABLE FREQUENCY SYNTHESISER INCORPORATING THE VARIABLE MODULUS INTERPOLATOR

(75) Inventors: Michael Francis Keaveney, Lisnagry (IE); William P. Hunt, Castletroy (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/149,866

(22) Filed: Jun. 10, 2005

(65) Prior Publication Data

US 2005/0231408 A1 Oct. 20, 2005

Related U.S. Application Data

(63) Continuation of application No. 10/172,323, filed on Jun. 14, 2002, now Pat. No. 6,927,716.

(60) Provisional application No. 60/298,862, filed on Jun. 15, 2001.

(51) Int. Cl.
*H03M 3/00* (2006.01)

(52) U.S. Cl. ...................................... 341/143; 341/144

(58) Field of Classification Search ................ 341/143, 341/144; 375/376
See application file for complete search history.

(56) References Cited

U.S. PATENT DOCUMENTS 4,107,669 A 8/1978 Tewksbury
4,772,871 A * 9/1988 Suzuki et al. ............... 341/155

(Continued)

FOREIGN PATENT DOCUMENTS

JP H05-506338 9/1993

(Continued)

OTHER PUBLICATIONS

Kozak M. et al. "A pipelined all-digita-sigma modulator for fractional-N frequency synthesis", Proceedings of the 17th IEEE Instrumentation and Measurement Technology conference, Cat. No. 00CH37066, IEEE Piscataway, NJ, USA, vol. 2., 2002, pp. 1153-1157 vol. XP002297660, ISBN: 0-7803-5890-2, no month.

(Continued)

*Primary Examiner*—Peguy JeanPierre
*Assistant Examiner*—Joseph Lauture
(74) *Attorney, Agent, or Firm*—Iandiorio & Teska

(57) ABSTRACT

An indirect variable frequency synthesiser for synthesising selectable frequencies from a reference frequency including a multi-divisor programmable frequency divider located in a feedback loop of the frequency synthesiser for dividing the feedback frequency in the feedback loop, the divider being responsive to a varying control signal applied thereto representative of a rational number of selectable value for selecting the divisor thereof for fractional division of the feedback frequency. A variable modulus interpolator converts a fractional part of the rational number of selectable value to a varying digital code representative of the fractional part of the rational number. The variable modulus interpolator includes an Nth order sigma-delta modulator having N sigma-delta stages cascaded in MASH configuration, where N is an integer greater than one, and is responsive to a selectable value of a numerator and a selectable value of a denominator of the fractional part of the rational number for outputting the varying digital code. A primary summer sums a digital code representative of a selectable value of the integer of the rational number with the varying digital code from the variable modulus interpolator to produce the varying control signal for applying to the programmable frequency divider.

20 Claims, 3 Drawing Sheets

U.S. PATENT DOCUMENTS

| | | | | |
|---|---|---|---|---|
| 4,816,774 A | * | 3/1989 | Martin | 331/1 A |
| 4,965,531 A | * | 10/1990 | Riley | 331/1 A |
| 5,038,117 A | * | 8/1991 | Miller | 331/16 |
| 5,068,661 A | | 11/1991 | Kaneaki et al. | |
| 5,311,181 A | | 5/1994 | Ferguson, Jr. et al. | |
| 5,563,535 A | | 10/1996 | Corry et al. | |
| 5,648,779 A | | 7/1997 | Cabler | |
| 5,838,270 A | | 11/1998 | Kiriaki | |
| 6,002,273 A | | 12/1999 | Humphreys | |

FOREIGN PATENT DOCUMENTS

| | | |
|---|---|---|
| JP | 2645525 | 5/1997 |
| JP | H09-321617 | 12/1997 |
| JP | 2001-237709 | 8/2001 |
| JP | 2000-194402 | 1/2002 |
| JP | 2002-57732 | 2/2002 |
| JP | 2002-325109 | 11/2002 |

OTHER PUBLICATIONS

Filiol, Norman M., and Thomas a.D. Riley, et al. "An Agile ISM Band Frequency Synthesizer with Built-In GMSK Data Modulation," IEEE Journal of Solid-State Circuits 33.7, Jul. 1988: 998-1008.

Brennan, P.V., R. Walkington, A. Borkjak and I. Thompson. "Very High-speed Sigma-delta Fractional-N Synthesizer". Electronics Letters 36.4, Feb. 2000: 298-300.

Kenny, Terrence P., Thomas A.D. Riley, Norman M. Filiol, and Miles A. Copeland. "Design and Realization of a Digital Delta Sigma Modulator for Frantional-n Frequency Synthesis." IEEE Transactions on Vehicular Technology 48.2, Mar. 1999: 510-521.

* cited by examiner

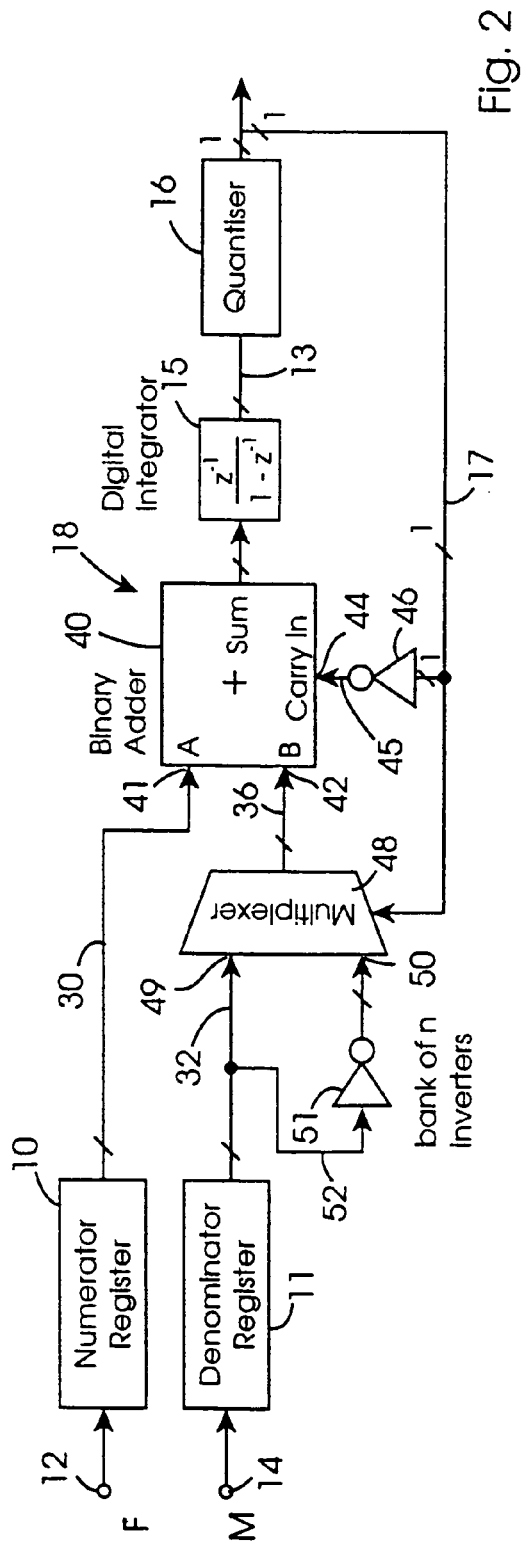
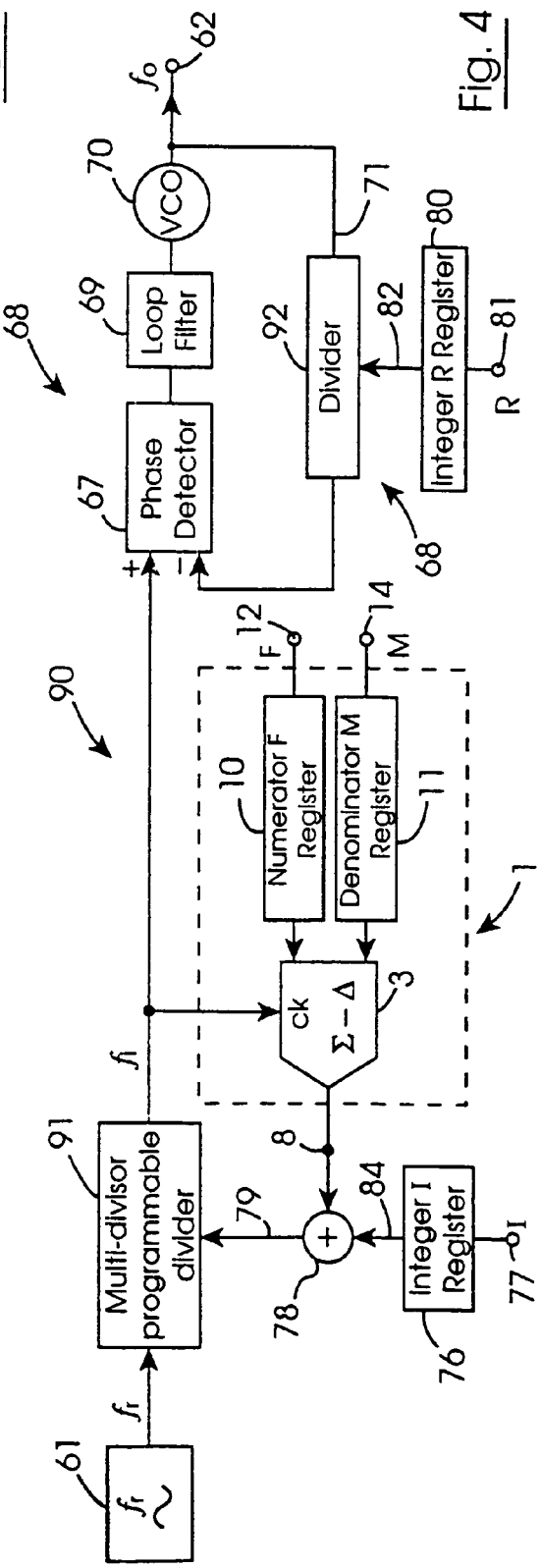
Fig. 2
Fig. 4

VARIABLE MODULUS INTERPOLATOR, AND A VARIABLE FREQUENCY SYNTHESISER INCORPORATING THE VARIABLE MODULUS INTERPOLATOR

RELATED APPLICATIONS

This application is a continuation patent application of U.S. patent application Ser. No. 10/172,323, filed Jun. 14, 2002 is now a U.S. Pat. No. 6,927,716, entitled "A Variable Modulus Interpolator, and a Variable Frequency Synthesiser Incorporating the Variable Modulus Interpolator", which claims benefit of U.S. Provisional Application No. 60/298,862, filed Jun. 15, 2001, entitled "An Interpolator, and a Variable Frequency Synthesiser Incorporating the Interpolator".

FIELD OF THE INVENTION

The present invention relates to a variable modulus interpolator, and in particular, to a variable modulus interpolator for interpolating a fraction to a varying digital code representative of the fraction, wherein the varying digital code may be summed with a digital value of an integer of a rational number including the fraction to provide a control signal for applying to a multi-divisor divider of a frequency synthesiser, for providing varying values of divisor to the divider for fractional division to produce a desired output frequency. In particular, the invention relates to such a variable modulus interpolator where the numerator and the denominator of the fraction are selectable. The invention also relates to a variable frequency synthesiser incorporating the variable modulus interpolator.

BACKGROUND OF THE INVENTION

Variable synthesisers for synthesising an output frequency from a reference frequency are extensively used where a range of selectable frequencies are required. Radio communications, and in particular, telecommunications are fields where variable frequency synthesisers are extensively used. Such variable frequency synthesisers may be direct frequency synthesisers or indirect frequency synthesisers. However, whether direct or indirect, all such frequency synthesisers include a frequency divider, which may be a dual divisor divider, or a multi-divisor programmable divider. In a dual divisor divider the divide by integer by which the divider divides the frequency varies between an integer value I and the integer value I+1. To divide the frequency passing through the divider by a rational number which includes an integer and a fraction, the divide by integer by which the frequency is divided is varied between the integer value I and the integer value I+1 over a series of divides. The average of the divides over a series of divides equals the rational number.

In a multi-divisor divider the divide by integer value of the divisor is varied through a number of integer values around the integer part of the rational number in order that over a series of divides, the average of the divides is equal to the rational number. Such dividers are controlled by a digital control signal which provides the varying values of the divide by integer of the divisor for the respective divisions. The fractional part of the rational number by which the frequency is to be divided is interpolated by an interpolator which provides the varying digital code for appropriately varying the value of the divide by integer for the respective divisions. A summer sums the varying digital code from the modulator with a digital code representing the integer value of the rational number and outputs the varying summed code. The digital output from the summer is applied to the control input of the divider for appropriately varying the integer value of the divisor for the respective divisions.

Such interpolators for interpolating the fractional part of a rational number by which the frequency through a multi-divisor programmable divider is to be divided are known. For example, U.S. Pat. No. 5,038,117 of Miller discloses an interpolator comprising a MASH cascade configured third order sigma-delta modulator. In the interpolator of Miller only the numerator of the fraction is selectable. Indeed, this is the case in virtually all known interpolators. The fact that only the numerator of the fraction is selectable in an interpolator leads to a number of disadvantages. For example, in the case of an indirect synthesiser which is implemented as a phase lock loop circuit, in which a dual or multi-divisor divider is located in the feedback loop, without complex mathematical computation for selecting integer values and the numerator values of rational numbers by which the feedback frequency is to be divided, it is not possible to provide series of selectable frequencies in steps of constant frequency between adjacent selectable frequencies, wherein different frequency series have different frequency step sizes, which are not integer related.

There are many applications where it is desirable to be able to provide selectable frequency series wherein the frequency step size between adjacent frequencies is easily variable from frequency series to frequency series. For example, in the field of mobile telecommunications two commonly used communication standards require that the selectable frequencies be stepped through frequency steps of different size. Under the GMS standard, communication is carried out in frequency channels around 900 MHz, but in frequency steps of 200 kHz, while under the IS-136 standard, communication is carried out in channels around 900 MHz, but in frequency steps of 30 kHz. Thus, it is desirable that a frequency synthesiser be provided which permits series of selectable frequencies to be selected in which the frequency step size between adjacent selectable frequencies is variable from series to series.

The transfer function of and indirect frequency synthesiser is $$\frac{(MI + F)}{M}$$

where I is the integer of a rational number, F is the numerator and M is the denominator of a fractional part of the rational number by which the feedback frequency is to be divided. Thus, the output frequency from such an indirect frequency synthesiser is thus given by the equation $$f_o = \frac{MI + F}{M} f_r$$

where $f_o$ is the output frequency and $f_r$ is the reference frequency from which $f_o$ is being synthesised. Thus, if it were possible to selectively vary the denominator of the fractional part of a rational number by which the frequency is to be divided, series of selectable frequencies could be synthesised, in which the frequency step size between adjacent selectable frequencies could readily easily be varied from series to series.

U.S. Pat. No. 4,816,774 of Martin discloses a variable frequency synthesiser which includes a variable modulus interpolator which permits both the numerator and denominator of the fraction being interpolated to be selectively varied. However, in the interpolator of Martin, two accumulators are required for determining the varying digital code for providing varying values of divisor to the divider. The capacity of the two accumulators must be variable for accommodating selection of the denominator of the fraction. Such accumulators and their associated circuitry tend to be relatively complex, particularly when the capacity is other than a power of two, and furthermore, when implemented as an integrated circuit require significant die area compared to an accumulator of capacity fixed to a power of two. Additionally, an offset value is required to be calculated by trial and error in order to minimise the level of spurious responses for each frequency channel.

U.S. Pat. No. 4,965,531 of Riley also discloses an indirect frequency synthesiser which includes an interpolator for interpolating the fractional part of a rational number divider. The interpolator includes a sigma-delta modulator, and the denominator of the fraction part of the integer which is selectable is written into a positive register and a negative register. Depending on the output of the quantiser of the sigma-delta modulator, the positive or negative value of the denominator is selected and is returned in the negative feedback loop of the sigma-delta modulator for adding to the numerator of the fraction. The sigma-delta modulator is a second order sigma-delta modulator and includes a pair of series connected accumulators through which the summed value of the numerator and the denominator are passed. However, the sigma-delta modulator includes two integrators in a single feedback loop, and thus, tends to be unstable. In fact the interpolator of Riley is only stable when interpolating fractions where the numerator lies between minus half the denominator and plus half the denominator. Furthermore, if the interpolator of Riley is implemented with a sigma-delta modulator of higher order than second order, the range of numerator values within which the interpolator remains stable is further reduced. This imposes significant limitations on the variable modulus interpolator of Riley.

There is therefore a need for a variable modulus interpolator in which the numerator and the denominator of the fraction being interpolated by the interpolator are respectively selectable, and furthermore, which outputs a varying digital code for providing varying values of integer divisors corresponding to the fractional part of a rational number for applying to a control input to a multi-divisor frequency divider, or for other purposes, where it is required to interpolate a fraction into a varying digital code representative of the fraction.

The present invention is directed towards providing such a variable modulus interpolator. The invention is also directed towards providing a variable frequency synthesiser incorporating such a variable modulus interpolator.

SUMMARY OF THE INVENTION

According to the invention there is provided a variable modulus interpolator for interpolating a fraction to a varying digital code representative of the fraction, the variable modulus interpolator comprising an Nth order sigma-delta modulator having N cascaded sigma-delta stages, where N is an integer greater than one, the sigma-delta modulator being responsive to the numerator and the denominator of the fraction for outputting the varying digital code, the values of the numerator and the denominator being selectable.

Preferably, the N sigma-delta stages of the sigma-delta modulator are cascaded in MASH configuration. Advantageously, each sigma-delta stage of the sigma-delta modulator comprises a feedback loop.

In one embodiment of the invention a multiplier is located in the feedback loop of each sigma-delta stage for multiplying the value represented by the feedback signal in the feedback loop of the stage by the selected value of the denominator of the fraction prior to summing of the negative value of the feedback signal with the stage input to the sigma-delta stage. Preferably, the stage input to the first sigma-delta stage is the selected value of the numerator of the fraction, and the stage input to each subsequent sigma-delta stage is the negative value of the quantisation noise from the previous sigma-delta stage.

In one embodiment of the invention each sigma-delta stage comprises an integrator for integrating the sum of the stage input and the negative value of the signal fed back to the stage input from the feedback loop, a quantiser for quantising the output of the integrator, the output of the quantiser being fed back through the feedback loop, and a first summer for summing the negative value of the signal from the feedback loop with the stage input to the sigma-delta stage and for outputting the sum to the integrator.

In another embodiment of the invention each of the sigma-delta stages from the first stage to the N−1 stage is provided with a second summer for summing the output of the integrator of the stage with the negative value of the output of the multiplier for providing the negative value of the quantiser noise to the stage input of the next sigma-delta stage.

In another embodiment of the invention the quantiser in each sigma-delta stage is a single bit output quantiser. Preferably, the single bit output of the quantiser of each sigma-delta stage is representative of the sign value of the output of the integrator of the stage. Advantageously, the output of the quantiser of each stage is representative of the most significant bit of the signal received from the integrator of the sigma-delta stage.

In one embodiment of the invention each sigma-delta stage is arranged to integrate in twos complement arithmetic, and the output of the quantiser of each stage represents the sign value of the output of the integrator of the stage.

In another embodiment of the invention the multiplier of each sigma-delta stage is implemented as a switching circuit which selectively applies one of the selected value of the denominator and its negative value to the first summer of the sigma-delta stage in response to the state of the output bit from the quantiser of the stage for effecting multiplication of the denominator by the sign value represented by the output of the quantiser. Preferably, the selected value of the denominator is applied to a first input of the switching circuit of each sigma-delta stage, and the selected value of the denominator is applied to a second input of the switching circuit through an inverter circuit. Advantageously, the selected value of the denominator is applied by the switching circuit to the first summer of each sigma-delta stage in response to the single bit output of the quantiser of the sigma-delta stage representing a negative sign, and the negative value of the selected denominator is applied by the switching circuit to the first summer in response to the single bit output of the quantiser of the sigma-delta stage representing a positive sign.

In one embodiment of the invention the switching circuit comprises a multiplexer.

In one embodiment of the invention the first summer of each sigma-delta stage comprises a binary adder having a first input for receiving the stage input to the sigma-delta stage, and a second input for receiving the one of the positive or negative values of the selected denominator from the switching circuit of the stage, the binary adder summing the respective inputs on the first and second inputs, and outputting the sum to the integrator of the sigma-delta stage.

In another embodiment of the invention the binary adder of each sigma-delta stage comprises a carry-in input for receiving the negative value of the single bit output of the quantiser of the stage, and for summing the negative value of the single bit output of the quantiser with the input on the first and second inputs of the binary adder.

In one embodiment of the invention a third summer is provided for summing the quantised outputs of the respective sigma-delta stages of the sigma-delta modulator to provide the varying digital code.

In another embodiment of the invention the quantised output from each stage from the second stage to the Nth stage is passed through m−1 differentiators where m is the stage number of the sigma-delta stage in the MASH configured cascade.

Preferably, a first register is provided for storing the selected value of the numerator of the fraction, and a second register is provided for storing the selected value of the denominator of the fraction, and advantageously, a first input is provided for inputting the selected value of the numerator to the first register, and a second input is provided for inputting the selected value of the denominator to the second register.

The invention also provides a direct variable frequency synthesiser for synthesising selectable output frequencies from a reference frequency, the frequency synthesiser comprising:

- a multi-divisor programmable frequency divider for dividing the reference frequency for synthesising a selected output frequency, the divider being responsive to a control signal for varying the divisor thereof for fractional division,
- a variable modulus interpolator for interpolating a fractional part of a rational number of selectable value to a varying digital code representative of the fraction, the variable modulus interpolator being responsive to selectable values of the numerator and the denominator of the fractional part of the rational number for outputting the varying digital code, and
- a primary summer for summing a digital code representative of a selected value of the integer of the rational number with the varying digital code from the variable modulus interpolator for providing a varying control signal to the programmable frequency divider for providing varying divisor values to the programmable frequency divider for fractional division to produce a selected synthesised output frequency in response to the selected value of the rational number.

In one embodiment of the invention the variable modulus interpolator comprises an Nth order sigma-delta modulator having N cascaded sigma-delta stages, where N is an integer greater than one.

In another embodiment of the invention the N sigma-delta stages of the sigma-delta modulator are cascaded in MASH configuration.

In a further embodiment of the invention a multiplier is located in the feedback loop of each sigma-delta stage for multiplying the value represented by the feedback signal in the feedback loop of the stage by the selected value of the denominator of the fraction prior to summing of the negative value of the feedback signal with the stage input to the sigma-delta stage. Preferably, the stage input to the first sigma-delta stage is the selected value of the numerator of the fraction, and the stage input to each subsequent sigma-delta stage is the negative value of the quantisation noise from the previous sigma-delta stage.

In one embodiment of the invention the output frequency from the multi-divisor programmable frequency divider is passed through a band pass filter, the band pass filter being centred on the output frequency, and preferably, the band pass filter is implemented as a phase lock loop.

The invention also provides an indirect variable frequency synthesiser for synthesising selectable frequencies from a reference frequency, and for varying the frequency step size between adjacent selectable frequencies of the selectable frequencies, the frequency synthesiser comprising:

- a multi-divisor programmable frequency divider in a feedback loop of the frequency synthesiser for dividing the feedback frequency in the feedback loop, the programmable frequency divider being responsive to a control signal for varying the divisor thereof for fractional division,
- a variable modulus interpolator for interpolating a fractional part of a rational number of selectable value to a varying digital code representative of the fraction, the variable modulus interpolator being responsive to selectable values of the numerator and the denominator of the fractional part of the rational number for outputting the varying digital code, and
- a primary summer for summing a digital code representative of a selected value of the integer of the rational number with the varying digital code from the variable modulus interpolator for providing a control signal to the programmable frequency divider for providing varying divisor values to the programmable frequency divider for fractional division of the feedback frequency to produce a selected synthesised output frequency in response to the selected value of the rational number,
- the frequency step size between adjacent selectable output frequencies of the selectable output frequencies being responsive to the selected value of the denominator of the fractional part of the rational number.

In one embodiment of the invention after the value of the denominator of the fractional part of the rational number has been selected, the synthesised output frequencies are selectable in response to the value of one or both of the numerator of the fractional part of the rational number and the integer of the rational number.

In another embodiment of the invention the variable modulus interpolator comprises an Nth order sigma-delta modulator having N cascaded sigma-delta stages, where N is an integer greater than one. Preferably, the N sigma-delta stages of the sigma-delta modulator are cascaded in MASH configuration. Advantageously, each sigma-delta stage of the sigma-delta modulator comprises a feedback loop.

In one embodiment of the invention a multiplier is located in the feedback loop of each sigma-delta stage for multiplying the value represented by the feedback signal in the feedback loop of the stage by the selected value of the denominator of the fraction prior to summing of the negative value of the feedback signal with the stage input to the sigma-delta stage.

In another embodiment of the invention the stage input to the first sigma-delta stage is the selected value of the numerator of the fraction, and the stage input to each subsequent sigma-delta stage is the negative value of the quantisation noise from the previous sigma-delta stage.

In a further embodiment of the invention each sigma-delta stage comprises an integrator for integrating the sum of the stage input and the negative value of the signal fed back to the stage input from the feedback loop, a quantiser for quantising the output of the integrator, the output of the quantiser being fed back through the feedback loop, and a first summer for summing the negative value of the signal from the feedback loop with the stage input to the sigma-delta stage and for outputting the sum to the integrator.

In one embodiment of the invention the quantiser in each sigma-delta stage is a single bit output quantiser. Preferably, the single bit output of the quantiser of each sigma-delta stage is representative of the sign value of the output of the integrator of the stage.

In another embodiment of the invention the multiplier of each sigma-delta stage is implemented as a switching circuit which selectively applies one of the selected value of the denominator and its negative value to the first summer of the sigma-delta stage in response to the state of the output bit from the quantiser of the stage for effecting multiplication of the denominator by the sign value represented by the output of the quantiser. Preferably, the selected value of the denominator is applied by the switching circuit to the first summer of each sigma-delta stage in response to the single bit output of the quantiser of the sigma-delta stage representing a negative sign, and the negative value of the selected denominator is applied by the switching circuit to the first summer in response to the single bit output of the quantiser of the sigma-delta stage representing a positive sign.

Ideally, a first register is provided for storing the selected value of the numerator of the fractional part of the rational number, a second register is provided for storing the selected value of the denominator of the fractional part of the rational number, and a third register is provided for storing the selected value of the integer of the rational number.

ADVANTAGES OF THE INVENTION

The advantages of the invention are many. A particularly important advantage of the invention is that the variable modulus interpolator permits independent selection of the numerator and denominator of the fraction being interpolated. Additionally, by virtue of the fact that the variable modulus interpolator is implemented as a second or higher order sigma-delta modulator with the sigma-delta stages cascaded, the varying digital code outputted by the modulator, which is representative of the fraction for applying to a control input of a multi-divisor divider is such that when applied to a frequency divider the frequency output from the divider is noise shaped. Furthermore, by virtue of the fact that the sigma-delta modulator is a second or higher order sigma-delta modulator with the sigma-delta stages cascaded, the interpolator is stable over the entire range of selectable values of both the numerator and the denominator. These advantages are further enhanced when the sigma-delta modulator is of MASH cascade configuration.

A particularly important advantage of the invention is achieved when the variable modulus interpolator is incorporated in a variable frequency synthesiser, and in particular, when the variable modulus interpolator is incorporated in an indirect variable frequency synthesiser. When incorporated in an indirect variable frequency synthesiser for selecting the divisor values of a multi-divisor divider in the feedback loop of a phase lock loop indirect frequency synthesiser, series of selectable frequencies may be synthesised with constant frequency steps between adjacent selectable frequencies, and the frequency step size is selectable by appropriately selecting the denominator of the fractional part of the rational number by which the feedback frequency is to be divided. This is a particularly important advantage when the variable frequency synthesiser is used in radio communications, and in particular, in mobile phone telecommunications in which different mobile phone communication standards require the selectable frequencies to be selectable with steps of constant frequency between adjacent selectable frequencies, but with the step size dependent on the communications standard.

These and other advantages of the invention will be readily apparent to those skilled in the art from the following description of some preferred embodiments thereof, which are given by way of example only, with reference to the accompanying drawings.

BRIEF DESCRIPTION OF THE DRAWINGS

FIG. 2 is a block representation of a detail of the variable modulus interpolator of FIG. 1;

FIG. 4 is a block representation of another variable frequency synthesiser incorporating the variable modulus interpolator of FIG. 1.

DETAILED DESCRIPTION OF PREFERRED EMBODIMENTS OF THE INVENTION

Figure 1:
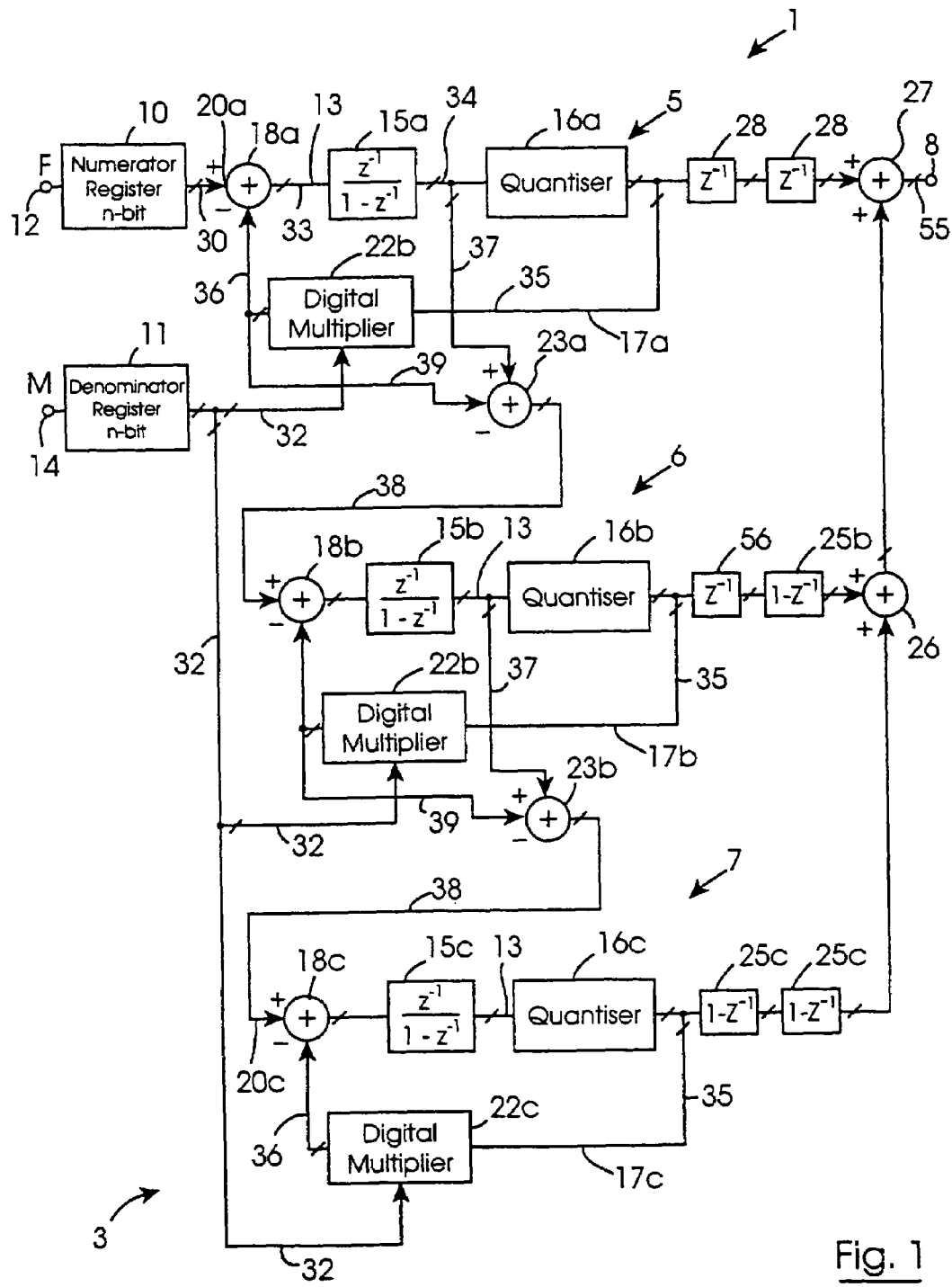
FIG. 1 is a block representation of a variable modulus interpolator according to the invention.

Referring to the drawings and initially to FIGS. 1 and 2, there is illustrated a variable modulus interpolator according to the invention, indicated generally by the reference numeral 1, for interpolating a fraction $$\frac{F}{M}$$

to a varying digital code for applying to a control input of a programmable multi-divisor frequency divider for providing varying values of divisors for fractional division to produce a desired output frequency from the divider. Such programmable frequency dividers will be described below with reference to FIGS. 3 and 4. The numerator of the fraction is F, and the denominator is M, and both are independently selectable, as will be described below. A clock frequency $f_c$ clocks the interpolator 1, and the clock frequency $f_c$ is normally derived from the divided frequency $f_d$ outputted by the divider as will be described below with reference to the variable frequency synthesisers described below with reference to FIGS. 3 and 4.

The interpolator 1 comprises a MASH configured Nth order sigma-delta modulator 3, which in this embodiment of the invention is a third order modulator 3 having three first order sigma-delta stages 5, 6 and 7 for interpolating the fraction $$\frac{F}{M}$$

and outputting the varying digital code on an output port 8. The term MASH refers to multi-stage noise shaping technique which was first described in a paper entitled "A 16 bit over-sampling A-to-D conversion technology using triple-integration noise shaping" by Y. Matsuya, K. Uchimura, A. Iwata, T. Kobayashi, M. Ishikawa and T. Yoshitome; published IEEE Journal Solid-State Circuits, Vol. 22, pages 921 to 929, December, 1987. A first n-bit register 10 is provided for storing a selected value of the numerator F of the fraction to be interpolated, and a second n-bit register 11 is provided for storing a selected value of the denominator M of the fraction to be interpolated. A first input port 12 is provided for inputting the selected value of the numerator F of the fraction to be stored in the first register 10, and a second input port 14 is provided for inputting the selected value of the denominator M of the fraction to the second register 11.

The three stages 5, 6 and 7 of the sigma-delta modulator are cascaded in MASH configuration, and each comprises a forward path 13 and a negative feedback loop 17. A digital integrator 15a, 15b and 15c is located in the forward path 13 of the sigma-delta stages 5, 6 and 7, respectively, the designation "a" after the reference numeral 15 indicating the integrator for the first sigma-delta stage 5, the designation "b" after the reference numeral 15 indicating the integrator 15 of the second sigma-delta stage 6, and the designation "c" indicating the integrator 15 of the third sigma-delta stage 7. Each integrator 15 is provided with a one clock cycle delay for introducing a corresponding one clock cycle delay in the forward path 13 of the corresponding sigma-delta stage 5, 6 and 7. A quantiser 16a, 16b and 16c is provided in the forward path 13 in each sigma-delta stage 5, 6 and 7, respectively, for quantising the output from the corresponding integrator 15. The output from the quantiser 16 of each sigma-delta stage 5, 6 and 7 is fed back through the corresponding negative feedback loop 17a, 17b and 17c to a corresponding first summer 18a, 18b and 18c of the corresponding sigma-delta stage 5, 6 and 7, respectively. A digital multiplier 22a, 22b and 22c, which is described in more detail below, is provided in the corresponding one of the feedback loops 17a, 17b and 17c, respectively, for multiplying the output of the corresponding quantiser 16 being fed back through the feedback loop 17 by the value of the denominator M stored in the second register 11. The first summer 18 of each sigma-delta stage 5, 6 and 7 sums the input to the corresponding sigma-delta stage 5, 6 and 7 on the stage input 20a, 20b or 20c with the negative value of the feedback signal multiplied by the value of the denominator M on the feedback loop 17, and outputs the summed value to the corresponding integrator 15a, 15b and 15c where the summed value is summed on each clock of the interpolator with the cumulative preceding integration values.

The input applied to the first sigma-delta stage 5 on the stage input 20a is the stored value of the numerator F of the fraction stored in the first register 10. The input to the stage inputs 20b and 20c of the second and third sigma-delta stages 6 and 7 is the negative value of the quantisation noise of the preceding stage 5 and 6. The quantisation noise of each of the first and second sigma-delta stages 5 and 6 is determined as the difference between the output from the multiplier 22 which is a function of the output of the quantiser 16 and the output of the integrator 15 of the corresponding sigma-delta stage 5 and 6. A second summer 23a and 23b is provided in each of the first and second sigma-delta stages 5 and 6 for deriving the negative value of the quantisation noise of the corresponding sigma-delta stage 5 and 6. The second summers 23 sum the output from the corresponding integrator 15 with the negative value of the output of the corresponding multiplier 22, and the summed value is outputted to the stage input 20 of the next subsequent sigma-delta stage 6 or 7.

Digital differentiators 25b and 25c differentiate the output from the quantisers 16b and 16c of the respective second and third sigma-delta stages 6 and 7, which are then summed in an intermediate summer 26, and the summed values are in turn summed with the output of the first sigma-delta stage 5 in a main summer 27. The output from the main summer 27 forms the varying digital code which is noise shaped, and which is applied to the output port 8. One differentiator 25b is provided for differentiating the quantised output from the second sigma-delta stage 6, while two differentiators 25c are provided for differentiating the quantised output from the third sigma-delta stage 7. In an N order sigma-delta modulator the number of differentiators provided at the output of each sigma-delta stage would be m−1 where m is the order of the stage. Pipeline delays 28 are provided at the outputs of the first and second stages 5 and 6 for compensating for the clock cycle delays introduced by the integrators 15 in the second and third stages 6 and 7 of the sigma-delta modulator 1. The number of pipeline delays provided in each stage m of an N order sigma-delta modulator is N-m pipeline delays.

The stored value of the numerator F in the first register 10 is applied to the first summer 18a of the first sigma-delta stage 5 on an n bit bus 30. The stored value of the denominator M in the second register 11 is applied from the second register 11 on an n bit bus 32 to the three multipliers 22 of the respective sigma-delta stages 5, 6 and 7. The respective sigma-delta stages 5, 6 and 7 are arranged to operate with twos complement arithmetic. The first summers 18 of the respective sigma-delta stages 5, 6 and 7 are of appropriate bit size, and the output from the respective summers 18 are applied to the corresponding integrator 15 on a bus 33 of appropriate bit size. Each integrator 15 is implemented as a fixed capacity integrator, and is of sufficiently large capacity so that an overflow from the integrator 15 does not occur. The outputs of the respective integrators 15 are applied on corresponding buses 34 of appropriate bit size to the corresponding quantiser 16 of the respective sigma-delta stages 5, 6 and 7. The quantisers 16 of the respective sigma-delta stages 5, 6 and 7 are one bit output quantisers, which quantise the output of the corresponding integrator 15 by its sign bit. In other words, the respective quantisers 16 output the most significant bit of the output from the corresponding integrator 15, which is thus the sign of the integrated output of the corresponding integrator 15. The output bit from each quantiser 16 is fed back on the feedback loop 17 of each sigma-delta stage 5, 6 and 7 on a 1-bit bus 35. The output from each digital multiplier 22 is applied on an appropriately sized bus 36 of the corresponding feedback loop 17 to the corresponding first summer 18. The output from the corresponding integrator 15 is applied on a bus 37 of appropriate bit size to the corresponding second summer 23, and the negative value of the output of the corresponding multiplier 22 is applied to the second summer 23 on a bus 39 of appropriate bit size. The respective second summers 23 in the first and second sigma-delta stages 5 and 6 are appropriately sized. The outputs of the respective second summers 23 are applied on corresponding buses 38 of appropriate bit size to the first summer 18 of the next sigma-delta stage 6 or 7.

In this embodiment of the invention since the respective sigma-delta stages 3, 6 and 7 are arranged to operate in twos complement arithmetic, the single bit output of each quantiser 16 being at logic zero represents a positive output from the corresponding integrator 15, while a logic one value of the single bit output of the respective quantisers 16 represents a negative output of the corresponding integrator 15.

Referring now in particular to FIG. 2, the implementation of the multipliers 22 in the respective sigma-delta stages 5, 6 and 7 and the implementation of the first summers 18 in the respective sigma-delta stages 5, 6 and 7 will now be described. Each first summer 18 comprises a binary adder 40 having a first input, namely, an A input 41 to which the stage input to the corresponding first summer 18 is applied. In the case of the adder 40 of the first summer 18$a$ of the first sigma-delta stage 5, the stored value of the numerator F stored in the first register 10 is applied on the bus 30 to the A input 41. In the case of the adder 40 of the first summers 18$b$ and 18$c$ of the second and third sigma-delta stages 6 and 7, the negative value of the quantiser noise is applied from the second summer 23 of the previous stage on the bus 38 to the A input 41 of the adder 40. For convenience the adder 40 and the implementation of the multiplier 22 of the first sigma-delta stages will be described with reference to FIG. 2. It will be understood that the implementation and operation of the first summer 18 and the multiplier 22 of the second and third sigma-delta stages 6 and 7 will be similar to that of the first stage 5 subject to the exceptions discussed above.

A second input, namely, a B input 42 is provided to the binary adder 40 for receiving the negative of the fed back signal on the bus 36 of the feedback loop 17. A carry-in input 44 receives the negative value of the 1 bit output from the quantiser 16 on a single bit bus 45 from the feedback loop 17. An inverter 46 inverts the output from the quantiser 16 from the feedback loop 17 to provide the negative value of the quantiser output.

The digital multiplier 22 in this embodiment of the invention is implemented as a switching circuit provided by a multiplexer 48. Since the single bit output of the quantiser 16 is the sign value of the output of the integrator 15, the multiplication of the quantiser output by the stored value of the denominator M is carried out by operating the multiplexer 48 to selectively multiplex the positive or negative value of the denominator M to the B input 42 of the adder 40, depending on the value of the single bit output of the quantiser 16. The stored value of the denominator is transferred from the second register 11 on the n bit bus 32 to a first input 49 of the multiplexer 48. The stored value of the denominator is passed through a bank of n inverters 51 in an n bit bus 52 to a second input 50 of the multiplexer 48 for providing the negative value of the denominator.

Accordingly, on the single bit output from the quantiser 16 of each stage 5 being zero representing a positive sign, the negative value of the denominator is switched from the second input 50 of the multiplexer 48 to the B input 42 of the adder 40, since the feedback loop 17 is a negative feedback loop. Alternatively, on the single bit output of the quantiser 16 being at logic one representing a negative sign, the positive value of the denominator on first input 49 of the multiplexer 48 is switched to the B input 42 of the adder 40.

The adder 40 of the first sigma-delta stage 5 adds the values of the numerator F, the positive or negative value of the denominator M and the inverted value of the quantiser output appearing on its A, B and carry-in inputs 41, 42 and 44, respectively and outputs the summed value to the integrator 15. The inverted value of the single bit output from the quantiser 16 is applied to the carry-in input 44 of the adder 40 in order that the output of the adder 40 is a correct representation of the sum of the numerator and the denominator of the fraction allowing for the signs thereof.

The adder 40 and the multiplexer 48 of the second and third sigma-delta stages 6 and 7 are identical to the adder 40 and the multiplexer 48 of the first sigma-delta stage 5. The positive or negative value of the denominator stored in the second register 11 is multiplexed by the multiplexer 48 to the B input 42 of the adder 40 depending on the value of the single bit output of the corresponding quantiser 16. The inverted value of the single bit output of the corresponding quantiser is applied to the carry-in input 44 of the adder 40. The only difference between the second and third sigma-delta stages 6 and 7 and the first sigma-delta stage 5 is that instead of the numerator F from the first register 10 being applied to the A input 41 of the adders 40 of the second and third stages 6 and 7, the negative value of the quantisation noise from the second summer 23 of the previous stage on the bus 38 is applied to the A input 41 of the adder 40 from the previous sigma-delta stage 5 and 6.

The outputs from the differentiators 25 of the second and third sigma-delta stages are outputted on two, three or four bit buses as appropriate, and the intermediate summer 26 is appropriately sized. The main summer 27 in which the output of the intermediate summer 26 is summed with the single bit output of the quantiser 16 of the first sigma-delta stage 5 is also appropriately sized. The output of the main summer 54, which is the varying digital code representative of the fraction $$\frac{F}{M}$$

is outputted on a bus 55 to the output port 8. The bus 55 is typically a 4-bit bus, although the bit size of the bus 55 will depend on the number of stages of the sigma-delta modulator 3, and for a third order sigma-delta modulator would be a 4-bit bus.

By passing the quantisation noise of the first and second sigma-delta stages 5 and 6 through the second and third sigma-delta stages 6 and 7, respectively, the varying digital code on the output bus 55 is noise shaped. Thus, when the varying digital code is applied to a control input of a multi-divisor frequency divider to provide varying values of divisors for fractional division of a frequency signal, quantisation noise in the output frequency of the frequency divider is noise shaped so that the quantisation noise in the output frequency can be filtered out by a low pass filter. Additionally, by virtue of the fact that the sigma-delta modulator is MASH configured, the interpolator is stable for all values of numerator F from zero to the value of the denominator.

In use, the selected values of the numerator F and denominator M of the fraction to be interpolated are written to the respective first and second registers 10 and 11 through the first and second input ports 12 and 14, respectively. The value of the numerator F is applied to the A input 41 of the adder 40 of the first sigma-delta stage 5, and is summed with the positive or negative value of the denominator M switched by the multiplexer 48 to the B input 42 of the adder 40 in response to the value of the single bit output of the quantiser 16 of the first sigma-delta stage 5. The inverted value of the output of the quantiser 16 on the carry-in input 44 of the adder 40 of the first sigma-delta stage 5 is also summed with the inputs on the A and B inputs 41 and 42 by the adder 40, and the sum is then applied to and integrated in the integrator 15 of the first sigma-delta stage 5 on each clock of the modulator 1. The integrator output 15 is quantised in the quantiser 16, and the sign value of the integrator output of the first sigma-delta stage 5 is applied to the main summer 27 by the quantiser 16.

As the sum of the numerator F and the positive or negative value of the denominator M are being integrated and quantised in the first sigma-delta stage 5, the quantisation noise from the first and second sigma-delta stages 5 and 6 is being respectively summed in the first adders 40 of the second and third sigma-delta stages 6 and 7 with the positive or negative values of the denominator M, depending on the value of the single bit output from the corresponding quantiser 16 of the respective second and third sigma-delta stages 6 and 7. The inverted value of the single bit output from the respective quantisers 16 are applied to the carry-in input 44 of the corresponding adder 40 and also summed with the inputs on the A and B inputs 41 and 42 in the adder 40. The integrators 15 of the second and third sigma-delta stages integrate the output of the corresponding adder 40 on each clock of the interpolator 1, which are then quantised in the corresponding quantiser 16. The quantised outputs from the second and third sigma-delta stages 6 and 7 are differentiated in the differentiators 25, and are in turn summed in the intermediate summer 26, and in turn are summed in the main summer 27 with the quantised output from the quantiser 16 of the first sigma-delta stage 5. The summed value of the outputs of the first, second and third sigma-delta stages 5, 6 and 7 from the main summer 27 are outputted on the output bus 55 to provide the varying digital code for applying to a control input of a multi-divisor frequency divider for providing varying values of divisor for fractional division. However, due to pipeline delays introduced by the integrators 15 of the first and second sigma-delta stages 5 and 6, the quantisation noise applied to the first adder 40 of the second and third stages 6 and 7 will be one clock cycle delayed from the previous sigma-delta stage 5 or 6. The advantage of introducing the clock cycle delay in the forward path of each sigma-delta stage is that it allows the operation of each stage to be pipelined by one clock cycle. This facilitates a high throughput rate through the sigma-delta modulator.

Figure 3:
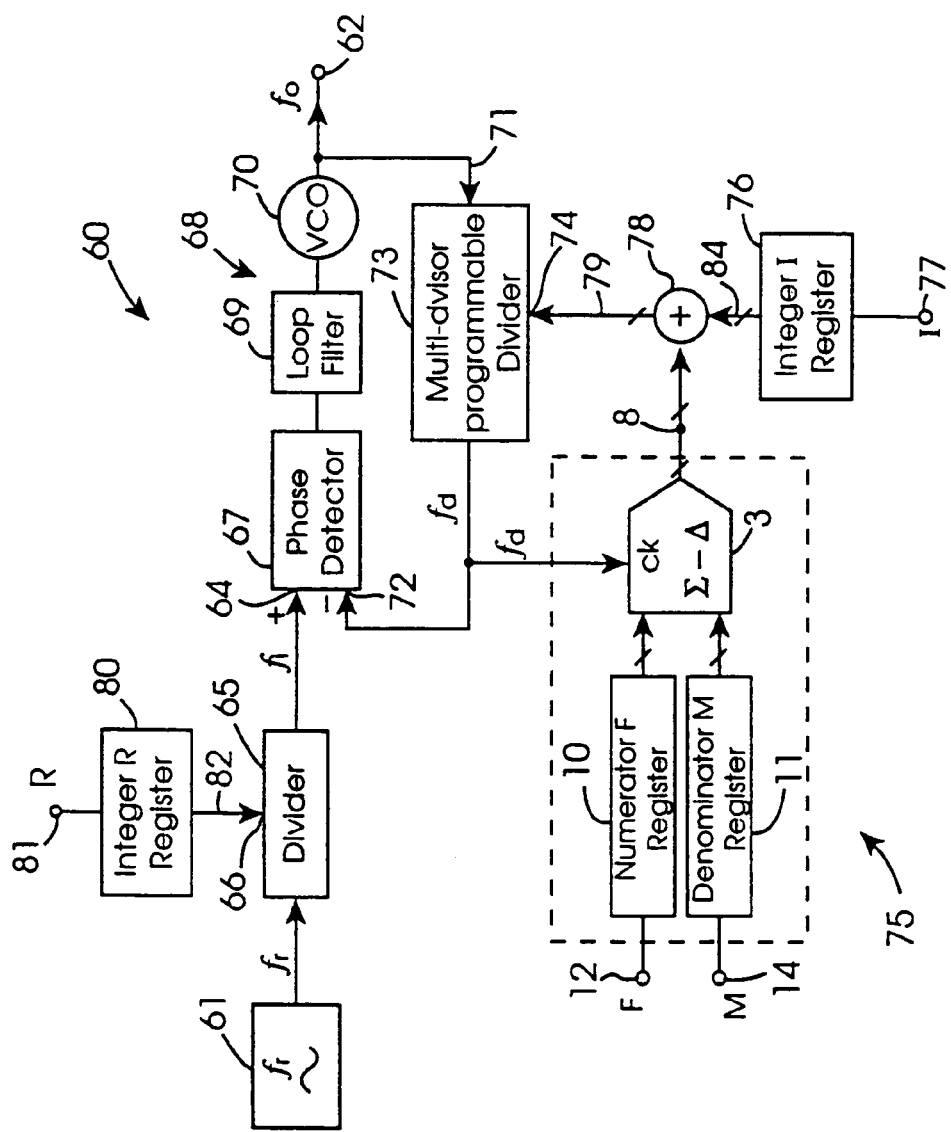
FIG. 3 is a block representation of a frequency synthesiser incorporating the variable modulus interpolator of FIG. 1.

Referring now to FIG. 3, there is illustrated a fractional N variable frequency synthesiser also according to the invention, indicated generally by the reference numeral 60, for synthesising selectable output frequencies $f_o$ from a reference frequency $f_r$ generated by a crystal oscillator 61, and for outputting the selected output frequency $f_o$ on a frequency output terminal 62. The synthesiser 60 in this embodiment of the invention is suitable for outputting a plurality of series of selectable frequencies in which the frequency step size between adjacent selectable frequencies is constant in each series but is selectable from series to series, as will be described below.

The synthesiser 60 comprises a direct frequency synthesiser provided by a selectable integer frequency divider 65 having a control input 66 for selecting the value of the integer R by which the reference frequency $f_r$ is to be divided to provide an intermediate output frequency $f_i$. The intermediate frequency $f_i$ outputted by the frequency divider 65 is applied to a first input 64 of phase detector 67 of a fractional N frequency synthesiser 68, which is implemented as a phase lock loop synthesiser. The output of the phase detector 67 is passed through a loop filter 69 to a voltage controlled oscillator 70 which generates the selected output frequency $f_o$. A negative feedback loop 71 feeds back the output frequency $f_o$ from the voltage controlled oscillator 70 through a multi-divisor programmable frequency divider 73 which divides the output frequency $f_o$ to a divided frequency $f_d$. The divided frequency $f_d$ is fed back through the negative feedback loop 71 to a second input 72 of the phase detector 67. The phase detector 67 compares the phase of the divided frequency $f_d$ with the phase of the intermediate frequency $f_i$, and outputs a voltage signal which is filtered in the loop filter 69, and applied to the voltage controlled oscillator 70 for driving the frequency output of the voltage controlled oscillator 70 to the selected output frequency $f_o$.

A control input 74 is provided to the frequency divider 73 for receiving a varying digital code for providing varying values of integer divisors by which the frequency $f_o$ is to be divided for fractional division to produce a selected frequency $f_o$. In this way the feedback frequency $f_o$ is divisible by a rational number having an integer part I and a fraction part $$\frac{F}{M}$$

The fraction part $$\frac{F}{M}$$

of the rational number is interpolated by a variable modulus interpolator, indicated generally by the reference numeral 75, which is similar to the variable modulus interpolator 1, and similar components are identified by the same reference numerals. For convenience the third order sigma-delta modulator 3 of the interpolator 1 is illustrated in block representation only in FIG. 3.

The selected values of the numerator F and the denominator M of the fraction part of the rational number are respectively written into the first and second registers 10 and 11 of the interpolator 75 through input ports 12 and 14, respectively. A third register 76 is provided for storing a digital value of the selected value of the integer I of the rational number. The selected value of the integer I is written to the third register 76 through a third input port 77. A primary digital summer 78 sums the value of the integer I stored in the third register 76 with the varying digital code outputted by the interpolator 75 on each clock of the interpolator 75 through the output port 8, which represents the value of the fraction part of the rational number. The summed integer part and fraction part of the rational number are applied to the control input 74 of the programmable frequency divider 73 on a bus 79. The interpolator 75 is clocked by the divided output frequency $f_d$ of the programmable frequency divider 73 so that when the varying code is summed with the integer value of the rational number on each clock the appropriate value of the divisor is applied to the control input of the programmable frequency divider 73.

A fourth register 80 stores a selected value of the integer R for selecting the divisor of the frequency divider 65. An input port 81 is provided for inputting a selected value of the integer R into the fourth register 80. The fourth register 80 will be of bit size sufficient to store allowed values of the integer R, which will be determined by the bit size of the control input 66 of the frequency divider 65. Typically, the bit size of the input 66 to the frequency divider 65 would be four bits. A 4-bit bus 82 transfers the value of the stored integer R in the fourth register 80 to the control input 66 of the frequency divider 65.

In general, the value of the integer I will be minimised in order to minimise noise gain, however, in general, the third register 76 will be a ten bit register. A correspondingly sized bus 84 transfers the value of the stored integer I in the third register 76 to the primary summer 78.

The fractional frequency synthesiser 60 is particularly suitable for synthesising series of selectable frequency of different frequency step sizes between selectable adjacent frequencies for use in mobile phone communications. The transfer function of the fractional synthesiser 60 is $$\frac{1}{R}\left(I + \frac{F}{M}\right).$$

Accordingly, the selectable output frequencies $f_o$ of the fractional synthesiser 60 are given by the equation $$f_o = \frac{1}{R}\left(I + \frac{F}{M}\right)f_r.$$

This equation can be written to give the value of $f_o$ as $$f_o = \frac{(MI + F)}{RM}f_r.$$

Accordingly, by varying the value of the denominator M and/or the integer R the frequency step size between adjacent selectable frequencies of respective selectable frequency series can be varied.

Various values of the integer R and the denominator M may be selected, however, the following are examples as to how the frequency step size between adjacent frequencies in respective frequency series can be selected, and also how when the step size has been selected, the frequency values of a selected frequency series can be selected. In these examples the variable frequency synthesiser 60 is described for synthesising frequencies suitable for communication under the GSM standard and under the IS-136 standard. Both standards operate at channel frequencies around 900 MHz. However, in GSM communication the frequency step size between adjacent selectable frequencies is 200 kHz, while in IS-136 standard the frequency step size between adjacent selectable frequencies is 30 kHz. In this embodiment of the invention the reference frequency generated by the crystal oscillator 61 is 13 MHz.

To synthesise the frequencies required to communicate under the GSM standard the value of the integer R is selected to be equal to one, and the value of the denominator M is selected to be equal to 65. With the values of R and M so selected, the frequency output equation becomes $$f_o = \frac{(65I + F)}{65}f_r.$$

With the reference frequency $f_r$ of 13 MHz, the values of the integer R and the denominator M so set, the frequency output signal $f_o$ can be selected in frequency steps of integer multiples of 200 kHz by selecting the value of the integer I equal to 67 for values of the numerator F up to 64, and by selecting the value of the integer I equal to 65 for values of F greater than 64, and then stepping the value of the numerator F in steps of unity from F=0 to F=64, as follows:

| $f_0$ | I | F | M |
|---|---|---|---|
| 883.80 | 67 | 64 | 65 |
| 884.00 | 68 | 0 | 65 |
| 884.20 | 68 | 1 | 65 |
| 884.40 | 68 | 2 | 65 | and so on

To synthesise the frequencies for communication in the IS-136 standard with the same reference frequency $f_r$ of 13 MHz, the value of the integer R is selected to be equal to 1, and the value of the denominator M is selected to be equal to 1,300, thus, the equation for the frequency output becomes $$f_{OUT} = \frac{1300I + F}{1300}f_r.$$

The frequency output signal $f_o$ can be selected in frequency steps of 30 kHz by selecting the value of the integer I equal to 67 for values of F up to 1,300, and 68 for values of F greater than 1,300, and by stepping the value of F in steps of 3 from 0 to 1,297, as follows:

| $f_0$ | I | F | M |
|---|---|---|---|
| 883.97 | 67 | 1297 | 1300 |
| 884.00 | 68 | 0 | 1300 |
| 884.03 | 68 | 3 | 1300 |
| 884.06 | 68 | 6 | 1300 | and soon

The fact that the frequency step sizes can be varied as described above without the need to provide separate reference frequencies provides a particularly important advantage in that the same loop filter 69 can be used in the phase lock loop synthesiser 68.

Other series of selectable frequencies to those already described with frequency steps the same or different to those already described can be similarly synthesised by selecting other values of R and M for selecting the frequency step size, and then by appropriately selecting the value of I for selecting the base frequency, and F for stepping the frequency of the series through the respective frequency steps.

In a practical implementation of the frequency synthesiser 60, a look-up table (not shown) will be provided with appropriate values of the integer R and the denominator M corresponding to frequency step sizes for series of selectable frequencies which are likely to be required for synthesising by the variable frequency synthesiser 60. The respective values of frequency step sizes will be correlated with the corresponding values of the integer R and the denominator M for selecting the respective step sizes. A series of look-up tables will also be provided with appropriate values of the integer I and the denominator F for selecting selectable frequencies within respective series of frequencies. The appropriate selectable frequency values will be correlated with the corresponding values of the integer I and the numerator F for their respective frequency series. Suitable circuitry will be provided which will permit inputting of appropriate data for selecting the respective selectable frequencies. For example, in a case where the variable frequency synthesiser 60 is provided for mobile telephone communications, an input would be provided to the suitable circuitry which would allow selection of the series of frequencies required for communication under the GSM standard and the IS-136 standard. A separate input would be provided for allowing inputting of the frequency value to be selected. The circuitry would then from the look-up tables select the appropriate values of the integer R and the denominator M from the look-up table for selecting the appropriate series of selectable frequencies, and the circuitry would then select the appropriate values of the integer I and the numerator F from the appropriate look-up table for synthesising the selected frequency.

Referring now to FIG. 4, there is illustrated a fractional N variable frequency synthesiser according to another embodiment of the invention, indicated generally by the reference numeral 90. The variable frequency synthesiser 90 is somewhat similar to the variable frequency synthesiser 60, and similar components are identified by the same reference numerals. The main difference between the variable frequency synthesiser 90 and the variable frequency synthesiser 60 is that the direct frequency divider is provided by a multi-divisor programmable frequency divider 91, and is operable under the control of the variable modulus interpolator 1. Selected values of the numerator F and denominator M of the fraction part of a rational number by which the frequency in the divider 91 is to be divided are written into the respective first and second registers 10 and 11 through the input ports 12 and 14 of the interpolator 1. The integer part I of the rational number is written into the third register 76 through the input port 77. Additionally, in this embodiment of the invention the indirect frequency synthesiser is provided by a phase lock loop similar to that of the indirect synthesiser 68, however, the frequency divider in the feedback loop 71 is a selectable integer divider 92. The integer value by which the frequency passing through the divider 92 is to be divided is written into the fourth register 80 through the input port 81.

Accordingly, the transfer function of the frequency synthesiser 90 is given by the equation $$\frac{R}{I + \frac{F}{M}}.$$

This can be rewritten as $$\frac{RM}{MI + F}.$$

Accordingly, the selectable output frequencies $f_o$ which can be synthesised by the variable frequency synthesiser 90 are given by the following equation:

$$f_o = \frac{RM}{MI + F} f_r.$$

It will be appreciated that if desired the direct frequency synthesiser which is provided by the frequency divider 65 may be omitted from the variable frequency synthesiser 60 described with reference to FIG. 3. It will also be appreciated that the indirect frequency synthesiser 68 may be omitted from the variable frequency synthesiser 90 described with reference to FIG. 4. By omitting the direct frequency synthesiser 65 from the variable frequency synthesiser 60, the equation for the selectable output frequencies $f_o$ of the frequency synthesiser 60 would become:

$$f_o = \frac{MI + F}{M} f_r.$$

Accordingly, in this case the frequency step size between adjacent selectable frequencies of respective series of selectable frequencies would be selected by selecting the value of the denominator M.

By omitting the indirect frequency synthesiser 68 from the variable frequency synthesiser 90, the equation for the selectable output frequencies $f_o$ would become:

$$f_o = \frac{M}{MI + F} f_r.$$

It is envisaged that the indirect frequency synthesiser 68 of the variable frequency synthesiser 90 may be provided by a simple phase lock loop without the divider 92 in the feedback loop. In which case the phase lock loop would act as a band pass filter for filtering the intermediate frequency, the frequency of which would become the output frequency of the synthesiser 90.

While in the variable modulus interpolator described with reference to FIGS. 1 and 2, the multiplication of the output of the quantiser fed back in the negative feedback loop of the corresponding sigma-delta stage by the value of the denominator M, has been described as being implemented by a multiplexer, it is envisaged that in embodiments of the invention where the output of the respective quantisers of the respective sigma-delta stages of the sigma-delta modulator are multi-bit outputs, the multiplication will be carried out in a suitable digital multiplier in each stage. The implementation of the multiplier as a multiplexer in general is only suitable for use in sigma-delta stages where the output of the quantiser is a single bit output. The implementation of the multiplier by a multiplexer in the feedback loop of each sigma-delta stage is a particularly advantageous implementation of the invention, since it leads to a relatively simple, inexpensive and uncomplicated implementation of the invention, which requires minimum die area in an integrated circuit chip.

It will also be appreciated that instead of passing the value of the denominator M from the second register 11 through a bank of inverters to provide the negative value of the denominator M to the multiplexer, the negative value of the denominator M could be stored in a separate register from which the negative value of the denominator M would be applied to the input 50 of the multiplexer 48. It will also be appreciated that other suitable binary adders may be provided for adding the stored value of the numerator F and the appropriate one of the positive and negative value of the denominator M besides the binary adder 40, and such adders will depend on the type of arithmetic used, and in certain cases, the need to carry in the inverted value of the output bit from the quantiser may not be required, since this is a particular requirement when the arithmetic is based on twos complement arithmetic.

It will also be appreciated that while the interpolator has been described as being implemented by a third order sigma-delta modulator, the interpolator may be a second order interpolator, or of any order higher than a third order. Additionally, it is envisaged that while the sigma-delta modulator has been described as being implemented in MASH cascade configuration, the sigma-delta modulator may be provided in other suitable cascade configurations.

While the registers, buses, adders, integrators and other components of the sigma-delta modulator have been described as being of specific bit sizes, components of other bit sizes could be used, and the selection of the bit size of the components and buses will be appropriately selected depending on the function of the interpolator and the variables to be interpolated. While the sigma-delta modulator has been described as comprising clock delays provided in the forward paths of the respective sigma-delta stages of the modulator, clock delays could alternatively be located in the feedback paths of the sigma- delta stages. Such variations, and other variations in the sigma-delta modulator will be well known to those skilled in the art, and it is not intended that the specific description of the sigma-delta modulator should in any way limit the scope of the invention.

While the clock cycle delay has been described as being introduced in the integrator in the forward path of each sigma-delta stage, it is envisaged that the clock cycle delay may be introduced instead in the feedback paths of the respective sigma-delta stages. This will be readily apparent and understood by those skilled in the art.

Needless to say, it will be appreciated that depending on the order of the sigma- delta modulator the appropriate pipelining will be implemented.

What is claimed is:

1. An indirect variable frequency synthesiser for synthesising selectable frequencies from a reference frequency, the frequency synthesiser comprising:
   a multi-divisor programmable frequency divider located in a feedback loop of the frequency synthesiser for dividing the feedback frequency in the feedback loop, the divider being responsive to a varying control signal applied thereto representative of a rational number of selectable value for selecting the divisor thereof for fractional division of the feedback frequency,
   a variable modulus interpolator for converting a fractional part of the rational number of selectable value to a varying digital code representative of the fractional part of the rational number, the variable modulus interpolator comprising an Nth order sigma-delta modulator having N sigma-delta stages cascaded in MASH configuration, where N is an integer greater than one, and being responsive to a selectable value of a numerator and a selectable value of a denominator of the fractional part of the rational number for outputting the varying digital code, and
   a primary summer for summing a digital code representative of a selectable value of the integer of the rational number with the varying digital code from the variable modulus interpolator to produce the varying control signal for applying to the programmable frequency divider.

2. An indirect variable frequency synthesiser as claimed in claim 1 in which each sigma-delta stage of the variable modulus interpolator is provided with a stage input, the stage input to the first sigma-delta stage being adapted for receiving the selected value of the numerator of the fractional part of the rational number, and each sigma-delta stage comprises a feedback loop, a multiplier being located in the feedback loop of each sigma-delta stage for multiplying the value representative of the feedback signal in the corresponding feedback loop by the selected value of the denominator of the fractional part of the rational number prior to summing of the negative value of the feedback signal with the stage input to the corresponding sigma-delta stage.

3. An indirect variable frequency synthesiser as claimed in claim 2 in which the input to the stage input of each of the second and subsequent sigma-delta stages is the negative value of the quantisation noise from an immediately preceding one of the sigma-delta stages.

4. An indirect variable frequency synthesiser as claimed in claim 2 in which each sigma-delta stage comprises an integrator for integrating the sum of the input to the stage input and the negative value of the signal fed back to the stage input by the corresponding feedback loop, a quantiser for quantising the output of the integrator, the output of the quantiser being fed back through the corresponding feedback loop, and a first summer for summing the negative value of the signal from the feedback loop with the input to the stage input and for outputting the sum to the integrator.

5. An indirect variable frequency synthesiser as claimed in claim 4 in which the quantiser in each sigma-delta stage is a single bit output quantiser.

6. An indirect variable frequency synthesiser as claimed in claim 5 in which the single bit output of the quantiser of each sigma-delta stage is representative of the sign value of the output of the integrator of the stage.

7. An indirect variable frequency synthesiser as claimed in claim 6 in which the multiplier of each sigma-delta stage is implemented as a switching circuit which selectively applies one of the selected value of the denominator and its negative value to the first summer of the sigma-delta stage in response to the state of the output bit from the quantiser of the stage for effecting multiplication of the value of the signal representative of the selected value of the denominator by the sign value represented by the output of the quantiser.

8. An indirect variable frequency synthesiser as claimed in claim 7 in which the selected value of the denominator is applied by the switching circuit to the first summer of each sigma-delta stage in response to the single bit output of the quantiser of the sigma-delta stage representing a negative sign, and the negative value of the selected value of the denominator is applied by the switching circuit to the first summer in response to the single bit output of the quantiser of the sigma-delta stage representing a positive sign.

9. An indirect variable frequency synthesiser as claimed in claim 1 in which a first register is provided for storing the selected value of the numerator of the fractional part of the rational number, a second register is provided for storing the selected value of the denominator of the fractional part of the rational number, and a third register is provided for storing the selected value of the integer of the rational number.

10. An indirect variable frequency synthesiser for synthesising selectable frequencies from a reference frequency, and for varying the frequency step size between adjacent selectable frequencies of the selectable frequencies, the frequency synthesiser comprising:

a multi-divisor programmable frequency divider located in a feedback loop of the frequency synthesiser for dividing the feedback frequency in the feedback loop, the divider being responsive to a varying control signal applied thereto representative of a rational number of selectable value for selecting the divisor thereof for fractional division of the feedback frequency, a variable modulus interpolator for converting a fractional part of the rational number of selectable value to a varying digital code representative of the fractional part of the rational number, the variable modulus interpolator comprising an Nth order sigma-delta modulator having N sigma-delta stages cascaded in MASH configuration, where N is an integer greater than one, and being responsive to a selectable value of a numerator and a selectable value of a denominator of the fractional part of the rational number for outputting the varying digital code, and a primary summer for summing a digital code representative of a selectable value of the integer of the rational number with the varying digital code from the variable modulus interpolator to produce the varying control signal for applying to the programmable frequency divider, the frequency step size between adjacent selectable output frequencies of the selectable output frequencies being responsive to the selected value of the denominator of the fractional part of the rational number.

11. An indirect frequency synthesiser as claimed in claim 10 in which the synthesised output frequencies are selectable by selecting values of one or both of the numerator of the fractional part of the rational number and the integer of the rational number.

12. An indirect variable frequency synthesiser as claimed in claim 10 in which each sigma-delta stage of the variable modulus interpolator is provided with a stage input, the stage input to the first sigma-delta stage being adapted for receiving the selected value of the numerator of the fractional part of the rational number, and each sigma-delta stage comprises a feedback loop, a multiplier being located in the feedback loop of each sigma-delta stage for multiplying the value representative of the feedback signal in the corresponding feedback loop by the selected value of the denominator of the fractional part of the rational number prior to summing of the negative value of the feedback signal with the stage input to the corresponding sigma-delta stage.

13. An indirect variable frequency synthesiser as claimed in claim 12 in which the input to the stage input of each of the second and subsequent sigma-delta stages is the negative value of the quantisation noise from an immediately preceding one of the sigma-delta stages.

14. An indirect variable frequency synthesiser as claimed in claim 12 in which each sigma-delta stage comprises an integrator for integrating the sum of the input to the stage input and the negative value of the signal fed back to the stage input by the corresponding feedback loop, a quantiser for quantising the output of the integrator, the output of the quantiser being fed back through the corresponding feedback loop, and a first summer for summing the negative value of the signal from the feedback loop with the input to the stage input and for outputting the sum to the integrator.

15. A direct variable frequency synthesiser for synthesising selectable output frequencies from a reference frequency, the frequency synthesiser comprising:

a multi-divisor programmable frequency divider for dividing the reference frequency for synthesising a selected output frequency, the divider being responsive to a varying control signal applied thereto representative of a rational number of selectable value for selecting the divisor thereof for fractional division of the reference frequency, a variable modulus interpolator for converting a fractional part of the rational number of selectable value to a varying digital code representative of the fractional part of the rational number, the variable modulus interpolator comprising an Nth order sigma-delta modulator having N sigma-delta stages cascaded in MASH configuration, where N is an integer greater than one, and being responsive to a selectable value of a numerator and a selectable value of a denominator of the fractional part of the rational number for outputting the varying digital code, and a primary summer for summing a digital code representative of a selectable value of the integer of the rational number with the varying digital code from the variable modulus interpolator to produce the varying control signal for applying to the programmable frequency divider.

16. A direct variable frequency synthesiser as claimed in claim 15 in which each sigma-delta stage of the variable modulus interpolator is provided with a stage input, the stage input to the first sigma-delta stage being adapted for receiving the selected value of the numerator of the fractional part of the rational number, and each sigma-delta stage comprises a feedback loop, a multiplier being located in the feedback loop of each sigma-delta stage for multiplying the value representative of the feedback signal in the corresponding feedback loop by the selected value of the denominator of the fractional part of the rational number prior to summing of the negative value of the feedback signal with the stage input to the corresponding sigma-delta stage.

17. A direct variable frequency synthesiser as claimed in claim 16 in which the input to the stage input of each of the second and subsequent sigma-delta stages is the negative value of the quantisation noise from an immediately preceding one of the sigma-delta stages.

18. A direct variable frequency synthesiser as claimed in claim 17 in which each sigma-delta stage comprises an integrator for integrating the sum of the input to the stage input and the negative value of the signal fed back to the stage input by the corresponding feedback loop, a quantiser for quantising the output of the integrator, the output of the quantiser being fed back through the corresponding feedback loop, and a first summer for summing the negative value of the signal from the feedback loop with the input to the stage input and for outputting the sum to the integrator.

19. A direct variable frequency synthesiser as claimed in claim 15 in which the output frequency from the multi-divisor programmable frequency divider is passed through a band pass filter, the band pass filter being centred on the output frequency.

20. A direct variable frequency synthesiser as claimed in claim 19 in which the band pass filter is implemented as a phase lock loop.

* * * * *